United States Patent [19]

Konantz et al.

[11] 3,886,585

[45] May 27, 1975

[54] SOLDERABLE MULTILAYER CONTACT FOR SILICON SEMICONDUCTOR

[75] Inventors: Mark L. Konantz; Ronald K. Leisure, both of Kokomo, Ind.

[73] Assignee: General Motors Corporation, Detroit, Mich.

[22] Filed: July 2, 1973

[21] Appl. No.: 375,688

[52] U.S. Cl. .................. 357/67; 357/71; 75/134 M; 29/198

[51] Int. Cl. .................. H01l 6/00

[58] Field of Search .................. 317/234, 5.2, 5.3; 29/196.6, 198; 75/82

[56] References Cited

UNITED STATES PATENTS

| | | | |
|---|---|---|---|
| 3,621,564 | 11/1971 | Tanaka et al. | 29/590 |
| 3,622,385 | 11/1971 | Stork | 117/217 |
| 3,746,944 | 7/1973 | Naraoka et al. | 317/234 |

*Primary Examiner*—Michael J. Lynch
*Assistant Examiner*—E. Wojciechowicz
*Attorney, Agent, or Firm*—Robert J. Wallace

[57] ABSTRACT

A multilayer solderable low resistance contact for N-type and P-type regions on a semiconductor body comprising an aluminum layer directly on the semiconductor body, and a nickel alloy layer on the aluminum layer, in which the nickel alloy layer contains 1 – 20% by weight manganese.

2 Claims, 1 Drawing Figure

Patented May 27, 1975 3,886,585
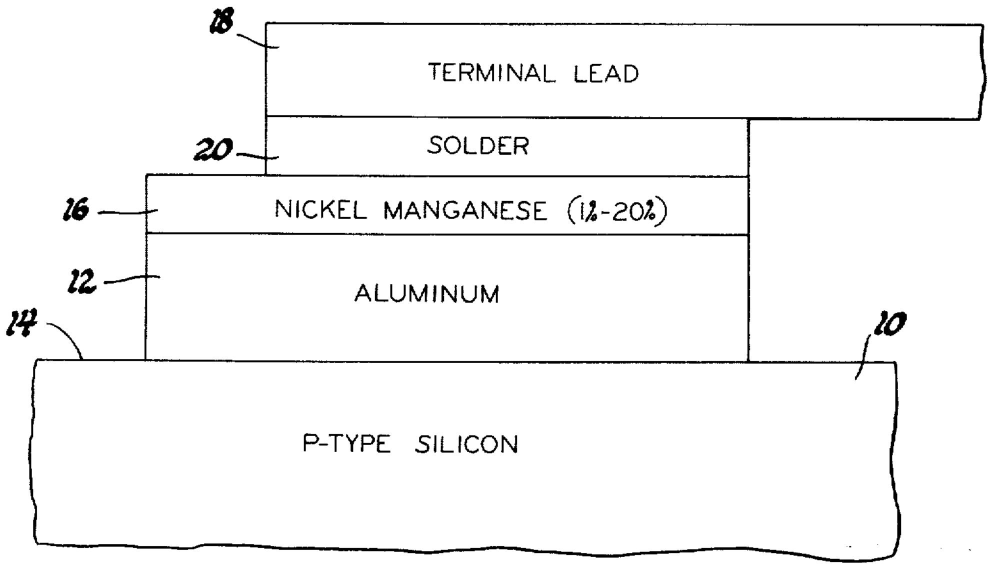

SOLDERABLE MULTILAYER CONTACT FOR SILICON SEMICONDUCTOR

BACKGROUND OF THE INVENTION

This invention relates to ohmic contacts on semiconductive bodies, and more particularly to an improved multilayer low resistance solderable contact that can be used on both N-type silicon and P-type silicon.

In the past, nickel layers have been used as single layer solderable ohmic contacts directly on N-type silicon. In such contacts, the nickel layer is applied by electroless deposition from an aqueous solution containing nickel sulfate and sodium hypophosphite. The plated silicon body is heated after the nickel is deposited. After heating at a moderate temperature, the nickel layer has a low contact resistance on N-type silicon. This is due to a significant phosphorus concentration in the nickel layer. However, the phosphorus concentration that reduces contact resistance on N-type silicon, increases it on P-type silicon. Hence, for lowest resistance solderable ohmic contacts on P-type silicon, other approaches have been used.

Excellent low resistance contacts are regularly made to P-type and N-type silicon with a specially microalloyed aluminum layer. However, aluminum is not readily solderable. It is generally known to coat aluminum with one or more layers of another metal, to provide an outer layer that is solderable. Various metals and deposition techniques can be used. In making semiconductor devices vacuum deposition is frequently used. Coatings of pure nickel can be conveniently applied to aluminum by vacuum deposition. Pure nickel provides a highly solderable surface, and does not introduce undesirable impurities to the semiconductor surface. However, the adhesion of pure nickel to aluminum is unsatisfactory. It is not as strong as either the aluminum-silicon bond, or the nickel-solder bond.

We have found that it is as difficult to get pure nickel to adhere to aluminum as it is to get solder to do so. For example, when a silicon element having an aluminum-pure nickel multilayer contact is soldered to a supporting substrate and subjected to bending stresses, the nickel separates from the aluminum to produce electrode failure.

We have found that by using a manganese-nickel alloy instead of pure nickel we can obtain better adhesion to aluminum, without introducing undesirable impurities to the semiconductor surface, increasing the number of processing steps, or reducing solderability.

OBJECTS AND SUMMARY OF THE INVENTION

It is, therefore, an object of this invention to provide an improved multilayer solderable contact on silicon. This and other objects of the invention are obtained with an aluminum layer on silicon, and a layer on the aluminum of nickel containing about 1 – 20% by weight manganese.

BRIEF DESCRIPTION OF THE DRAWING

The FIGURE in the drawing diagrammatically shows a terminal lead soldered to a multilayered electrode made in accordance with the invention.

DESCRIPTION OF THE PREFERRED EMBODIMENTS

The contact of this invention can be used to ohmically attach a semiconductor die to a supporting substrate, or to ohmically attach a terminal lead to the die. The drawing illustrates the latter, and serves as one specific example of the invention. The layers shown are not drawn to scale, to better illustrate the novel multilayer contact involved. The multilayer contact is formed on a P-type portion 10 of a silicon semiconductor device. This portion, for example, can be the collector region of a PNP transistor or the base region of an NPN transistor. A film 12 of aluminum is on the surface 14 and microalloyed thereto. A film 16 of nickel containing 5% manganese is on the aluminum film 12. A Kovar terminal lead 18 is attached to the nickel film 16 by means of a solder layer 20. Solder layer 20 can be of any suitable solder, such as 90% by weight lead and 1% by weight tin. Fundamentally our nickel alloy film 16 serves two purposes. It provides an adherent layer on an aluminum film, and also provides a layer that has a solderable surface. However, other layers readily adhere to our nickel alloy layer. It need not be the last or outer layer of a solderable electrode. One or more additional vacuum deposited layers of metal could be used over our nickel alloy layer 16, so long as the last layer applied provides a solderable surface. Additional layers of pure nickel, silver or gold might be used. On the other hand, since our special nickel layer is itself quite solderable, we prefer to use only the two layers 12 and 16.

Our electrode is of special interest in providing a low resistance solderable contact for P-type silicon because no such contact is available for P-type silicon. On the other hand, it works equally well on N-type silicon. Silicon semiconductor devices usually have both N-type and P-type regions. Now, the same metallization system can be used for good solderable contacts on both conductivity type regions. Our multilayer electrode can be used on both conductivity type regions because the initial layer of our contact is a microalloyed aluminum film. It is solderable because the outer layer is of a solderable metal. The difficulty with such a contact is in getting adequate adhesion between the aluminum and the subsequently applied metal layers. It is the weakest link in this electrode metallization system.

We have found that satisfactory adhesion to the aluminum layer can be obtained with a nickel alloy containing 1– 20% by weight manganese. By nickel alloy we mean a compound intimate mixture or other like nickel composition containing manganese. The nickel composition should contain more than 1% by weight manganese to consistently obtain good adhesion under all conditions. On the other hand more than about 10% by weight manganese in the composition does not apparently increase adhesion, and over 20% by weight manganese adversely affects solderability.

The thickness of the aluminum coating is no more critical to the electrode of this invention than it is in the usual single layer aluminum ohmic contacts on N-type and P-type silicon. As a general rule the aluminum layer can be about 5,000 to 15,000 angstroms thick. The nickel alloy layer need only be thick enough to cover the aluminum layer with a continuous coating. An average thickness of about 3,000 angstroms is generally necessary to consistently obtain a continuous coating. Thicknesses in excess of about 5,000 angstroms do not appear to provide any increased benefits. Accordingly, we generally prefer our special nickel layer to have a thickness of about 3,000 to 5,000 angstroms.

Both the aluminum layer 12 and our nickel alloy layer 16 are preferably applied by vacuum deposition onto a preheated substrate for best results. The aluminum layer should be shallowly alloyed and quenched in the normal and accepted manner, to produce a low contact resistance on the semiconductor body. One technique by which low resistance aluminum layer can be made on both N-type and P-type silicon is disclosed in U.S. Pat. No. 3,108,359 Moore et al.

Our nickel alloy layer 16 can be vacuum deposited directly onto the aluminum using an appropriate nickel alloy source. The vacuum deposition can be by resistance heated or electron beam heated evaporation, or by sputtering. For vacuum evaporation the source can be an alloy of nickel and manganese, or a mixture of powdered nickel and powdered manganese. An alloy is preferred for the target if deposition is by sputtering. No unusual or critical deposition steps are required. On the other hand, the type of deposition and the substrate temperature used during deposition can affect the proportion of manganese preferred in the nickel alloy film produced. For example, when the film is produced by sputtering, even onto an unpreheated substrate, as little as about 1% by weight manganese can provide adequate adhesion. However, when the film is produced by vacuum evaporation from a resistance heated source onto a cold substrate, we prefer that the film contain 5 to 10% by weight manganese.

To make a solderable multilayer electrode in accordance with this invention, a clean silicon substrate is placed in a vacuum evaporation chamber, and the chamber pumped down to a pressure of about $1 \times 10^{-6}$ Torr. The silicon substrate is preferably moderately heated to enhance adhesion of the aluminum to the silicon. While any substrate temperature up to 300° C. can be used, temperatures in excess of 150° C. provide best results, and we prefer 200° C. Aluminum is then evaporated from a tungsten heater onto the silicon substrate until a 10,000 angstrom layer of aluminum is deposited on the substrate. The substrate is then removed from the chamber, and the aluminum layer microalloyed. For microalloying, the aluminum coated substrate is placed in a furnace tube at 560° C. to 575° C. under an argon atmosphere for 3 to 5 minutes. The substrate is then immediately removed from the furnace tube, whereupon it quenches in air. After cooling to room temperature, it is placed back in the vacuum deposition chamber. The chamber is evacuated again to a pressure of $1 \times 10^{-6}$ Torr. As with the aluminum layer, it is desired to moderately heat the silicon substrate during the nickel alloy deposition. A substrate temperature of 200° C. – 260° C. is preferred. A 4,000 angstrom layer of nickel containing 5% manganese is then evaporated onto the microalloyed aluminum layer of the heated substrate. The substrate is then cooled to less than 100° C., the chamber brought up to atmospheric pressure, and the substrate removed from the vacuum chamber. A contact can then be soldered to the nickel in the usual manner.

The multilayer contact can be produced by sputtering, and need not be removed from the vacuum chamber for microalloying. In such event, the substrate is placed in a sputtering chamber and the system pumped down to a pressure of $1 \times 10^{-6}$ Torr. Concurrently, the substrate is moderately heated. A 4,000 angstrom layer of aluminum is sputtered from an aluminum target onto the substrate. Then, without removing the substrate from the sputtering chamber or changing the pressure, the substrate is heated to a temperature of 560° C. – 575° C. for approximately 3 to 5 minutes. The substrate is then quickly cooled to about 200° C. to 260° C. If quick cooling is not provided, the contact will still be of low resistance on P-type silicon but not on N-type silicon. A target of nickel containing 5% manganese is then charged, and a manganese-nickel layer about 4,000 angstroms thick deposited onto the microalloyed aluminum. After the manganese-nickel layer has been deposited, the substrate is cooled to 100° C. or less, and then removed from the sputtering chamber.

We claim:

1. An adherent low resistance solderable multilayer electrode on a silicon semiconductor body comprising a semiconductive body of silicon having a surface, a layer of aluminum on said surface in low electrical resistance contact therewith, and a nickel alloy layer on said aluminum layer at least about 3,000 angstroms thick, said nickel alloy layer consisting essentially of nickel and about 1– 20% by weight manganese.

2. An adherent low resistance solderable multilayer electrode on a silicon semiconductor body comprising a body of silicon having a surface, an aluminum first layer on said surface in low electrical resistance contact therewith, said aluminum first layer being about 5,000 – 15,000 angstroms thick, a second layer on said aluminum layer consisting essentially of nickel and about 5 – 10% by weight manganese, and said second layer being about 3,000 – 5,000 angstroms thick.

* * * * *